United States Patent
Lee

(10) Patent No.: US 9,309,588 B2
(45) Date of Patent: Apr. 12, 2016

(54) THIN FILM DEPOSITION SOURCE, DEPOSITION APPARATUS AND DEPOSITION METHOD USING THE SAME

(71) Applicant: Samsung Display Co., Ltd., Yongin, Gyeonggi-Do (KR)

(72) Inventor: Jong Woo Lee, Yongin (KR)

(73) Assignee: Samsung Display Co., Ltd., Gyeonggi-do (KR)

(*) Notice: Subject to any disclaimer, the term of this patent is extended or adjusted under 35 U.S.C. 154(b) by 0 days.

(21) Appl. No.: 14/037,244

(22) Filed: Sep. 25, 2013

(65) Prior Publication Data

US 2014/0154403 A1   Jun. 5, 2014

(30) Foreign Application Priority Data

Dec. 3, 2012   (KR) .......................... 10-2012-0139082

(51) Int. Cl.
    *C23C 16/52*     (2006.01)
    *C23C 14/04*     (2006.01)
    *C23C 14/54*     (2006.01)

(52) U.S. Cl.
    CPC .............. *C23C 14/044* (2013.01); *C23C 14/547* (2013.01)

(58) Field of Classification Search
None
See application file for complete search history.

(56) References Cited

U.S. PATENT DOCUMENTS

| | | | |
|---|---|---|---|
| 2002/0139666 A1* | 10/2002 | Hsueh et al. | 204/298.03 |
| 2004/0052942 A1* | 3/2004 | Bijkerk et al. | 427/248.1 |
| 2008/0216741 A1* | 9/2008 | Ling et al. | 118/712 |
| 2009/0127102 A1* | 5/2009 | Lee et al. | 204/192.38 |

FOREIGN PATENT DOCUMENTS

| | | |
|---|---|---|
| KR | 10-2006-0090887 A | 8/2006 |
| KR | 10-2008-0073915 A | 8/2008 |
| KR | 10-2012-0023273 A | 3/2012 |

* cited by examiner

*Primary Examiner* — Joseph Miller, Jr.
(74) *Attorney, Agent, or Firm* — Knobbe, Martens, Olson & Bear, LLP

(57) ABSTRACT

A thin film deposition source, a deposition apparatus and a deposition method using the same are disclosed. The deposition apparatus includes a deposition source including a plurality of jet nozzles that spray a deposition substance on a surface of a substrate and are arranged in a first direction, and at least one shutter controlling a jet region of the deposition substance by opening or shielding at least a portion of a jetting passageway of the deposition substance.

12 Claims, 13 Drawing Sheets

THIN FILM DEPOSITION SOURCE, DEPOSITION APPARATUS AND DEPOSITION METHOD USING THE SAME

CROSS-REFERENCE TO RELATED APPLICATIONS

This application claims priority from Korean Patent Application No. 10-2012-0139082 filed on Dec. 3, 2012 in the Korean Intellectual Property Office, the disclosure of which is incorporated herein by reference in its entirety.

BACKGROUND

1. Field of the Technology

The disclosed technology relates to a thin film deposition source, a deposition apparatus and a deposition method using the same.

2. Description of the Related Technology

Various processes for manufacturing a display apparatus, a semiconductor device, a solar cell, etc., mostly involve a thin film deposition process. Multiple thin films included in a liquid crystal display, a field emission display, a plasma display, and an electroluminescence display, for example, are formed by a deposition process.

Among various kinds of deposition processes, a vapor deposition process for forming a thin film on a substrate by evaporating a deposition substance is usually performed in a vacuum deposition chamber using a thermal deposition process. That is to say, a substrate is installed in a vacuum deposition chamber, and a deposition source facing one surface of the substrate is installed to allow the deposition substance to be evaporated by heating the deposition substance contained in a deposition source. The deposition substance in a gas phase is brought into contact with the substrate in a vacuum state to then be coagulated, thereby forming a thin film on the substrate.

Where a thin film is formed on a substrate by vapor deposition, it is necessary to control the thickness of the thin film. That is to say, it is necessary to uniformly or non-uniformly control the thickness of the thin film according to the characteristics of a target device. For example, where the thickness of the thin film is uniformly controlled, a deposition source may be installed at a place far from the center of the substrate and the substrate may then be rotated. However, in this instance, the deposition chamber may become bulky. In addition, since the deposition source is installed at a place far from the substrate center, most of the gaseous deposition substance jetted from the deposition source may be deposited in the deposition chamber rather than the substrate. In addition, when the substrate has a large area, it is difficult to rotate the substrate and the deposition chamber becomes bulky.

To overcome these drawbacks, several methods have been proposed, including a method of moving a deposition source in parallel with one surface of a substrate while fixing the substrate, and a method of moving a substrate in parallel with one surface of the deposition source while fixing the deposition source. In the proposed methods, it is not necessary to rotate the substrate. Thus, it is not necessary to unduly increase the size of the chamber. In addition, since a deposition is performed in a state in which the deposition source is positioned adjacent to the substrate, most of deposition substance may be deposited on one surface of the substrate. The proposed methods may be more appropriately applied when the substrate has a large area.

Here, the deposition source may include a plurality of jet nozzles linearly arranged in one direction having a length as the long or short side of the substrate. For example, when the deposition source includes a plurality of jet nozzles arranged in one direction with a length of the short side of the substrate, it moves in a long side direction of the substrate from a lower portion of one short side to a lower portion of the other side of the substrate and the deposition substance is deposited on one surface of the substrate. In such manner, the deposition source performs a deposition process by scanning one time. Alternatively, the deposition source may perform a deposition process while scanning multiple times, that is, by making multiple passes of the substrate.

To adjust the thickness of a thin film formed on a substrate surface, the shapes and arrangement of the jet nozzles may be adjusted. However, when substrates having various sizes employed the same deposition equipment, the jet nozzles should have various shapes and arrangements so as to correspond to the differing substrates. In addition, in order to vary the shapes and arrangement of the jet nozzles, it is necessary to remove the vacuum by repressurization of the deposition apparatus to make such changes, thereby losing processing efficiency.

SUMMARY OF CERTAIN INVENTIVE ASPECTS

A deposition apparatus aspect, which can control the thickness of a thin film deposited on one surface of a substrate without loss of a vacuum during a deposition process is disclosed.

Aspects relating to a deposition method, which can control the thickness of a thin film deposited on one surface of a substrate without loss of a vacuum during a deposition process are also disclosed.

Disclosed aspects also include a deposition source, which can control the thickness of a thin film deposited on one surface of a substrate without canceling a vacuum during a deposition process.

The above and other aspects will be described in or be apparent from the following description of the preferred embodiments.

According to an one aspect, a thin film deposition apparatus including a deposition source including a plurality of jet nozzles that jet a deposition substance for forming a thin film on one surface of a substrate and are arranged in a first direction, and at least one shutter controlling a jet region of the deposition substance by opening or shielding at least a portion of a jetting passageway of the deposition substance.

According to another aspect, a thin film deposition apparatus including a deposition source including at least one jet nozzle that jets a deposition substance deposited on one surface of a substrate, and at least one shutter positioned above the at least one jet nozzle and controlling a jet region of the deposition substance, wherein the shutter is controlled according to a difference between a thickness of the deposition substance deposited on the one surface of the substrate and a predetermined thickness of the deposition substance.

According to still another aspect, a thin film deposition method including forming a thin film on a substrate by jetting a deposition substance from a deposition source, measuring a thickness of the thin film and comparing the thickness of the thin film with a predetermined thickness, and when the thickness of the thin film is greater than the predetermined thickness, shielding at least a portion of a jet region of the deposition substance facing the thin film, wherein the jet region is between the substrate and the deposition source.

According to still another aspect, a thin film deposition source including a plurality of jet nozzles that jet a deposition substance deposited on one surface of a substrate and are arranged in a first direction, and at least one shutter controlling a jet region of the deposition substance by opening or shielding at least a portion of a jetting passageway of the deposition substance.

BRIEF DESCRIPTION OF THE DRAWINGS

The above and other features and advantages of the disclosed technology will become more apparent by describing in detail certain embodiments thereof with reference to the attached drawings in which.

DETAILED DESCRIPTION OF CERTAIN INVENTIVE EMBODIMENTS

Figure 1:
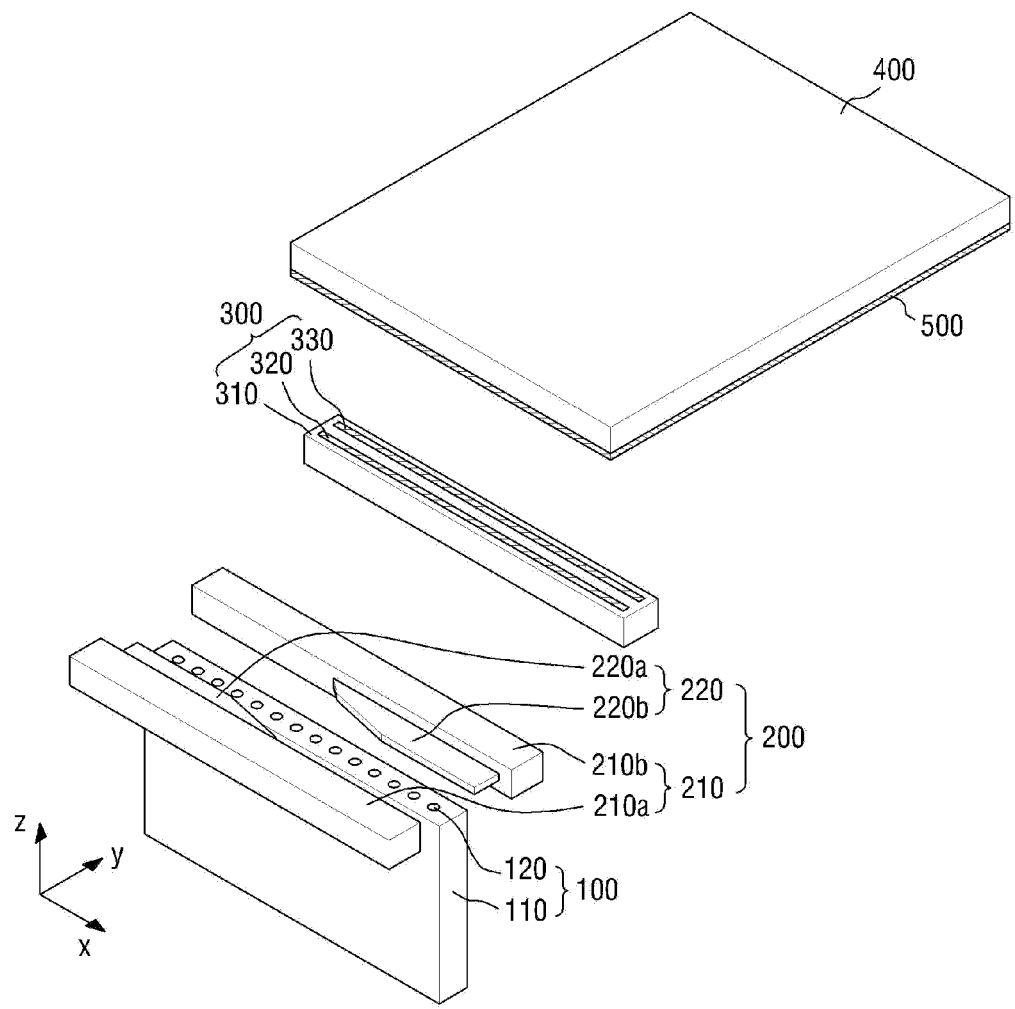
FIG. 1 is a perspective view of a deposition apparatus according to an embodiment of the technology.

The aspects and features of the disclosed technology and methods for achieving the aspects and features will be apparent by referring to the embodiments to be described in detail with reference to the accompanying drawings. However, the disclosed technology is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the invention, and the disclosed technology is only defined within the scope of the appended claims.

The term "on" that is used to designate that an element is on another element or located on a different layer or a layer includes both a case where an element is located directly on another element or a layer and a case where an element is located on another element via another layer or still another element. In the entire description of the disclosed technology, the same drawing reference numerals are used for the same elements across various figures.

Although the terms "first, second, and so forth" are used to describe diverse constituent elements, such constituent elements are not limited by the terms. The terms are used only to discriminate a constituent element from other constituent elements. Accordingly, in the following description, a first constituent element may be a second constituent element.

Hereinafter, embodiments of the disclosed technology will be described in further detail with reference to the accompanying drawings.

Figure 2:
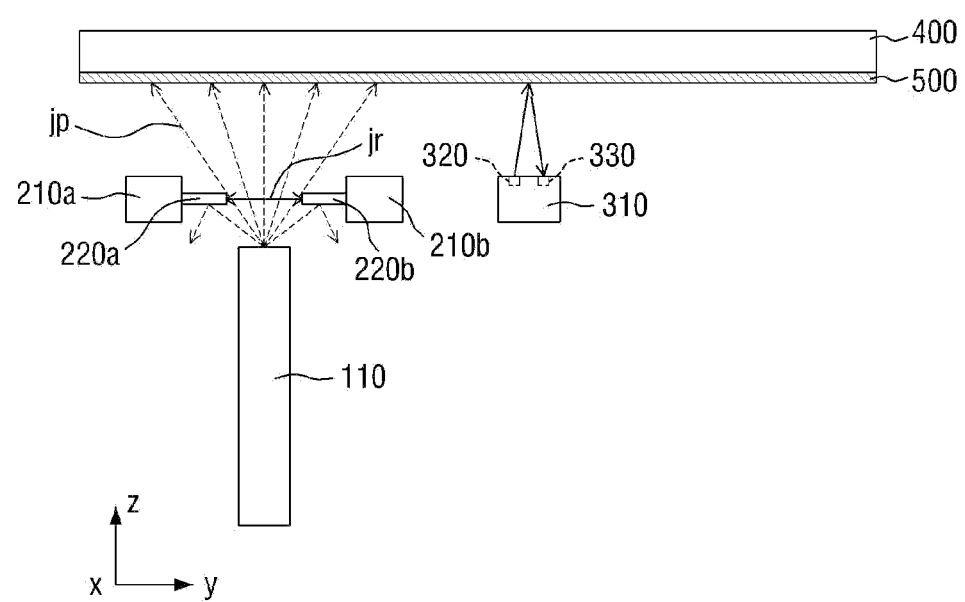
FIG. 2 is a side view of the deposition apparatus shown in FIG. 1.
Figure 3:
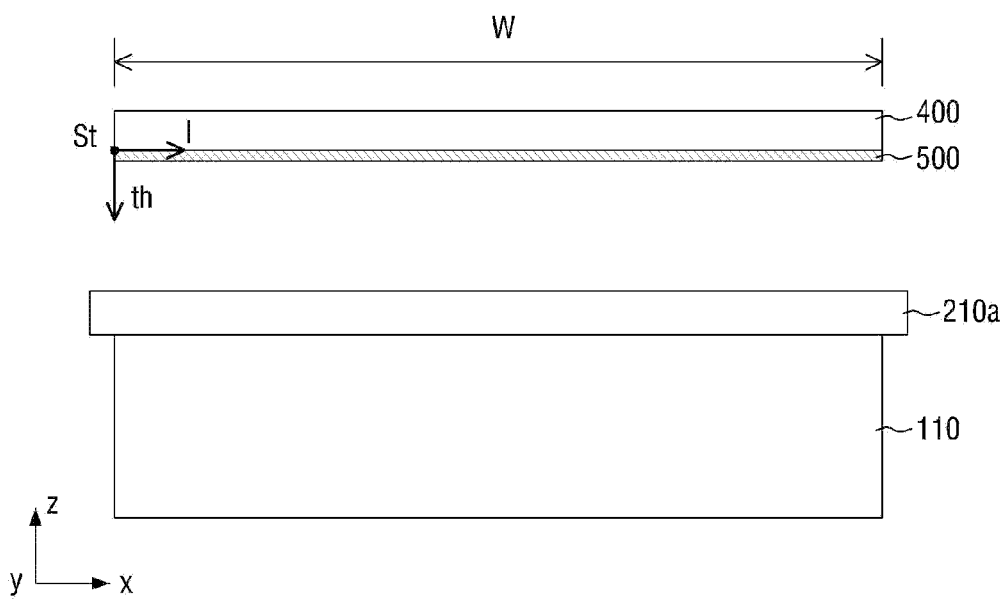
FIG. 3 is a front view of the deposition apparatus shown in FIG. 1.
Figure 4:
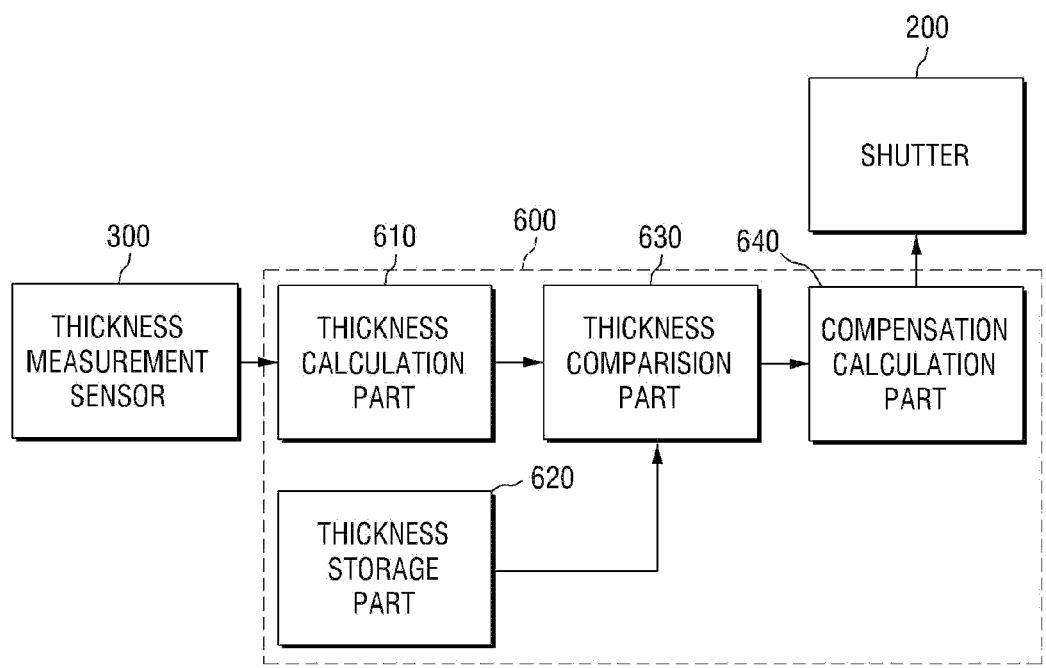
FIG. 4 is a block diagram of a controller of the deposition apparatus shown in FIG. 1.

FIG. 1 is a perspective view of a thin film deposition apparatus according to an embodiment of the disclosed technology, FIG. 2 is a side view of the deposition apparatus shown in FIG. 1, FIG. 3 is a front view of the deposition apparatus shown in FIG. 1, and FIG. 4 is a block diagram of a controller (600) of the deposition apparatus shown in FIG. 1.

Referring to FIGS. 1 to 4, the deposition apparatus includes a deposition source 100 and a shutter 200. In addition, the deposition apparatus may include a thickness measurement sensor 300 and a controller 600.

The deposition apparatus may be used for processes for manufacturing a display apparatus, a semiconductor device, a solar cell, etc. For example, the deposition apparatus may be used in processes for forming multiple thin films included in a liquid crystal display, a field emission display, a plasma display, and an electroluminescence display.

The deposition apparatus will typically include a deposition chamber (not shown). The inside of the deposition chamber is typically maintained in a vacuum state during a deposition process. In order to maintain the vacuum state, the deposition chamber may include at least one vacuum pump, e.g., a Cryo pump. The deposition source 100, the shutter 200, and the thickness measurement sensor 300 may be installed within the deposition chamber. The controller 600 may be installed inside or outside the deposition chamber.

The deposition source 100, the shutter 200, and the thickness measurement sensor 300 may be positioned in one part of the inside of the deposition chamber, and the substrate 400 may be positioned at another part of the inside of the deposition chamber. For example, in a deposition apparatus performing a vapor deposition process, the deposition source 100, the shutter 200, and the thickness measurement sensor 300 may be positioned in a lower portion of the deposition chamber, and the substrate 400 may be positioned in an upper portion of the deposition chamber.

The deposition source 100 jets a deposition substance on a surface of the substrate 400. The deposition source 100 will generally include a deposition source holder 110 and a jet nozzle 120. The deposition source holder 110 may have the deposition substance contained therein and may include a heater (not shown) that heats the deposition substance. The heater heats the deposition substance in a solid or liquid phase to generate a gaseous deposition substance, and jets the generated gaseous deposition substance out of the deposition source 100 through the jet nozzle 120. In the exemplary embodiment shown in FIGS. 1 and 3, the deposition source holder 110 may be shaped a rectangular parallelepiped formed to extend as long as a width W of the substrate in a first direction, but embodiments are not limited thereto.

The jet nozzle 120 is formed on one surface of the deposition source 100 to face one surface of the substrate 400 on which the deposition substance is deposited. The jet nozzle 120 generally includes a plurality of jet nozzles, which are arranged in the first direction. The jet nozzles 120 may be arranged in a row or in multiple rows. As shown in FIG. 1, each of the jet nozzles 120 may have an aperture formed in a circle, but embodiments are not limited thereto. Alternatively, each of the jet nozzles 120 may have an aperture formed in an ellipse or a polygon, and the respective jet nozzles 120 may have different shapes from each other. In addition, the plurality of jet nozzles 120 may be formed on the same plane, but at least one of the plurality of jet nozzles 120 may be formed on a different plane from the plane on which the others are formed. In addition, while FIG. 1 shows the plurality of jet nozzles 120 are equidistantly spaced apart from each other, but aspects of the disclosed technology are not limited thereto. Rather, the plurality of jet nozzles 120 may be spaced at different intervals apart from each other.

The plurality of jet nozzles 120 are generally arranged in the first direction by a length corresponding to the long side or short side of the substrate 400. In the exemplary embodiment shown in FIGS. 1 and 3, the plurality of jet nozzles 120 may be arranged by a width W of the substrate in a first direction. Here, the width W of the substrate may be a length of the short side of the substrate 400. As described above, when the plurality of jet nozzles 120 are arranged in parallel with the short side with the substrate 400 by a length corresponding to the short side of the substrate 400, the deposition source 100 moves in a long side direction of the substrate 400 from a lower portion of one short side of the substrate 400 to a lower portion of the other short side of the substrate 400 and may deposit the deposition substance on a surface of the substrate 400. In such manner, the deposition source 100 is used to perform a deposition process while scanning the substrate once. Alternatively, the deposition source 100 performs a deposition process while scanning multiple times or passes, that is, while reciprocating. In the exemplary embodiment shown in FIGS. 1 and 2, the plurality of jet nozzles 120 are arranged in a row in the x direction parallel with the short side of the substrate 400, while the deposition source 100 moves in the y direction parallel with the long side of the substrate 400 and jets the deposition substance in the z direction to thus deposit the deposition substance on the one surface of the substrate 400.

The shutter 200 is positioned above the jet nozzles 120 and opens or shields at least a portion of a jetting passageway jp of the deposition substance. That is to say, the shutter 200 may control a jet region jr of the deposition substance by opening or shielding at least the portion of the jetting passageway jp of the deposition substance. Here, the jetting passageway jp may be a moving route of the deposition substance jetted from the jet nozzles 120. The jet region jr may be a pass section of the deposition substance between the two shutters 200. In other words, jet region jr may be between the substrate 400 and the deposition source 100.

As described above, the jet region jr of the deposition substance is controlled, thereby adjusting a thickness (th) of the thin film 500 formed on one surface of the substrate 400, which corresponds to the controlled jet region jr.

The shutter 200 may be formed to extend in the same direction as the plurality of jet nozzles 120, that is, in the first direction. In addition, the shutter 200 may be arranged in parallel with the plurality of jet nozzles 120 and may be positioned above at least one side of the plurality of jet nozzles 120. In addition, the shutter 200 may be integrally formed with the deposition source 100. In addition, the shutter 200 may include a plurality of shutters. In an exemplary embodiment, the shutter 200 may include two shutters, and one of the two shutters may be positioned above one side of the plurality of jet nozzles 120 while the other may be positioned above the other side of the plurality of jet nozzles 120. In this case, the jetting passageway jp of the deposition substance jetted from the jet nozzles 120 may be established between the two shutters 200. That is to say, the two shutters 200 may serve as shutter members on the jet nozzles 120 to define the maximum jet region jr of the deposition substance. Referring to FIG. 2, a first shutter plate holder 210a and a second shutter plate holder 210b, which will later be described, may define the maximum jet region jr of the deposition substance. By use of the shutter mechanism, the fan spray can be selectively adjusted according to the desired thickness of the thin film to be laid down.

The shutter 200 may include a shutter plate holder 210, and a shutter plate 220. The shutter plate holder 210 supports the shutter plate 220 and is formed to extend as long as a width W of the substrate in a first direction and may be arranged in parallel with the plurality of jet nozzles 120. The shutter plate holder 210 may include a plurality of shutter plate holders. In the exemplary embodiment shown in FIGS. 1 and 2, two shutter plate holders 210 shaped of a rectangular parallelepiped, that is to say, the first shutter plate holder 210a and the second shutter plate holder 210b, may be formed at an upper portion of one side of the plurality of jet nozzles 120 and at an upper portion of the other side of the plurality of jet nozzles 120 to be symmetrical with each other.

The shutter plate 220 may substantially control the jet region jr of the deposition substance. The shutter plate 220 may protrude from the shutter plate holder 210 in a direction toward the jet nozzles 120 to control the jet region jr of the deposition substance. For example, referring to FIG. 2, the shutter plate 220 shields a portion of the jetting passageway jp of the deposition substance, as indicated by a dotted line, thereby narrowing the jet region jr of the deposition substance. The shutter plate 220 may slidably protrude from the shutter plate holder 210. In addition, the shutter plate 220 is fixed in a folded state to then protrude as it becomes unfolded. As described above, the shutter plate 220 may protrude in the direction toward the jet nozzles 120 in various manners.

The shutter plate 220 may include a plurality of shutter plates. In addition, the shutter plate holder 210 may include at least one shutter plate 220. In the exemplary embodiment shown in FIGS. 1 and 2, the first shutter plate 220a may be installed in a first shutter plate holder 210a, and the second shutter plate 220b may be installed in a second shutter plate holder 210b.

The shutter plate 220 may be installed on the internal surface of the shutter plate holder 210. Here, the internal surface of the shutter plate holder 210 may be one surface of the shutter plate holder 210 facing the jet nozzles 120. In addition, when a width of the shutter plate holder 210 is divided in half, the shutter plate 220 may be formed at either side. In the exemplary embodiment shown in FIG. 1, when a width of the first shutter plate holder 210a, as measured in the x direction, is divided in half, the first shutter plate 220a may be formed in the left side. When a width of the second shutter plate holder 210b, as measured in the x direction, is divided in half, the second shutter plate 220b may be formed in the right side.

The shutter plate 220 may protrude from the internal surface of the shutter plate holder 210 toward the jet nozzles 120 to be parallel with one surface of the substrate 400. In addition, when the shutter plate 220 includes a plurality of shutter plates, the plurality of shutter plates 220 may be formed on the same plane. In the exemplary embodiment shown in FIG. 1, the first shutter plate 220a and the second shutter plate 220b are formed on the same plane, but aspects of the disclosed technology are not limited thereto. Rather, the first shutter plate 220a and the second shutter plate 220b are formed on different planes.

The shutter plate 220 may be shaped of a plate. One end of the shutter plate 220 may be supported by the shutter plate holder 210 and the other end of the shutter plate 220 facing the one end of the shutter plate 220 may protrude toward the jet nozzles 120. In an exemplary embodiment, at least a portion of the other end of the shutter plate 220 may be folded. In other words, a protruded distance of the shutter plate 220 decreases in a direction toward a center of the shutter plate holder 210. In the exemplary embodiment shown in FIG. 1, the first shutter plate 220a is folded toward the first shutter plate holder 210a in the positive x direction, and the second shutter plate 220b is folded toward the second shutter plate holder 210b in the negative x direction. Also, the first shutter plate 220a and the second shutter plate 220b are symmetrical with respect to a center of the deposition source 100.

The thickness measurement sensor 300 will measure in real time thicknesses of the thin film 500 deposited on a surface of the substrate 400. The thickness measurement sensor 300 may be formed to extend in a first direction in which the plurality of jet nozzles 120 are arranged. In addition, the thickness measurement sensor 300 may be positioned to be parallel with the plurality of jet nozzles 120 and may move in the same direction as the direction in which the deposition source 100 moves. In addition, the thickness measurement sensor 300 may be integrally formed with the deposition source 100.

The thickness measurement sensor 300 may include sensor holder 310, a light emitting portion 320, and a light receiving portion 330. The sensor holder 310 may support the light emitting portion 320 and the light receiving portion 330 and may be shaped of a rectangular parallelepiped formed to extend in the first direction. The light emitting portion 320 and the light receiving portion 330 may be formed on one surface of the sensor holder 310 facing the one surface of the substrate 400 on which the deposition substance is deposited. The light emitting portion 320 and the light receiving portion 330 may be formed to be parallel with each other and may extend as long as a length of the short or long side of the substrate 400 in the first direction. In the exemplary embodiment shown in FIG. 1, the light emitting portion 320 and the light receiving portion 330 may be formed to extend by a length corresponding to the short side of the substrate 400, that is, by a width W of the substrate 400, in the x direction.

The light emitting portion 320 may irradiate light, as indicated by a solid line, into a thin film 500 deposited on one surface of the substrate 400 and the light receiving portion 330 may receive the light reflected from the thin film 500 to measure a thin film thickness (th). Since the length of the light emitting portion 320 and the light receiving portion 330 correspond to the width W of the substrate 400, the thickness measurement sensor 300 can measure the thin film thickness (th) in the first direction at one time. In addition, since the thickness measurement sensor 300 moves with the deposition source 100 in a direction perpendicular to the first direction and parallel with the one surface of the substrate 400, the thin film thickness (th) of the thin film deposited on the one surface of the substrate 400 can be measured by scanning one time. In addition, the thin film thickness (th) can be more accurately measured by scanning multiple times while reciprocating.

In these embodiments, the controller 600 controls the shutter 200 according to a difference between a measured thickness of the thin film 500, as measured by the thickness measurement sensor 300 (to be referred to as a measured thin film thickness (Th_m), hereinafter), and a predetermined thickness (to be referred to as a goal thin film thickness (Th_g), hereinafter). Although a position of the controller 600 is not illustrated, the controller 600 may be integrally with or separately from the deposition source 100 or the shutter 200. The controller 600 may include a thickness calculation part 610, a thickness storage part 620, a thickness comparison part 630, and a compensation calculation part 640.

The thickness calculation part 610 receives data of the measured thin film thickness Th_m from the thickness measurement sensor 300, and may obtain a graphic representation of the thin film thickness th depending on a thin film length (l) from a standard point in the first direction, to then provide the obtained graphic and representation to the thickness comparison part 630.

The thickness storage part 620 provides the predetermined goal thin film thickness Th_g to the thickness comparison part 630. The goal thin film thickness Th_g may be uniform or non-uniform throughout the substrate 400 according to characteristics of a desired device.

The thickness comparison part 630 receives the measured thin film thickness Th_m from the thickness calculation part 610 and the goal thin film thickness Th_g from the thickness storage part 620 and may calculate a difference between the measured thin film thickness Th_m and the goal thin film thickness Th_g depending on the thin film length (l) to then provide the calculated difference to the compensation calculation part 640. In an exemplary embodiment, data of a value obtained by subtracting the goal thin film thickness Th_g from the measured thin film thickness Th_m may be provided to the compensation calculation part 640.

The compensation calculation part 640 opens or shields the shutter 200 according to the difference between the measured thin film thickness Th_m and the goal thin film thickness Th_g.

In an exemplary embodiment for uniformly controlling the thin film thickness th, if a value obtained by subtracting the goal thin film thickness Th_g from the measured thin film thickness Th_m at a particular location spaced in the first direction a predetermined distance apart from the standard point St is a positive value, that is, if the measured thin film thickness Th_m is greater than the goal thin film thickness Th_g, the shutter plate 220 facing the particular location is made to protrude to shield the jetting passageway jp of the deposition substance. Here, the shutter plate 220 facing the particular location may be positioned directly below the particular location. In this case, the greater the absolute value of the value obtained by subtracting the goal thin film thickness Th_g from the measured thin film thickness Th_m, the more the shutter plate 220 protrudes, thereby shielding the jetting passageway jp of a larger amount of the deposition substance and narrowing the jet region jr of the deposition substance. If the shutter 200 is shielded in such a manner, an increasing ratio of the thickness th of the thin film 500 deposited on one surface of the substrate 400 corresponding to the shielded shutter 200 is reduced, thereby uniformly controlling the thin film thickness th.

In another exemplary embodiment for uniformly adjusting the thin film thickness th, if a value obtained by subtracting the goal thin film thickness Th_g from the measured thin film thickness Th_m at a particular location spaced in the first direction a predetermined distance apart from the standard point St is a negative value, that is, if the goal thin film thickness Th_g is greater than the measured thin film thickness Th_m, the shutter plate 220 facing the particular location is inserted into the shutter plate holder 210 or folded, thereby opening the jetting passageway jp of the deposition substance. In this case, the greater the absolute value of the value obtained by subtracting the goal thin film thickness Th_g from the measured thin film thickness Th_m, the more the shutter plate 220 is inserted or folded, thereby shielding the jetting passageway jp of a larger amount of the deposition substance and widening the jet region jr of the deposition substance. If the shutter 200 is opened in such a manner, an increasing ratio of the thickness th of the thin film 500 deposited on one surface of the substrate 400 corresponding to the opened shutter 200 is increased, thereby uniformly controlling the thin film thickness th.

Figure 5:
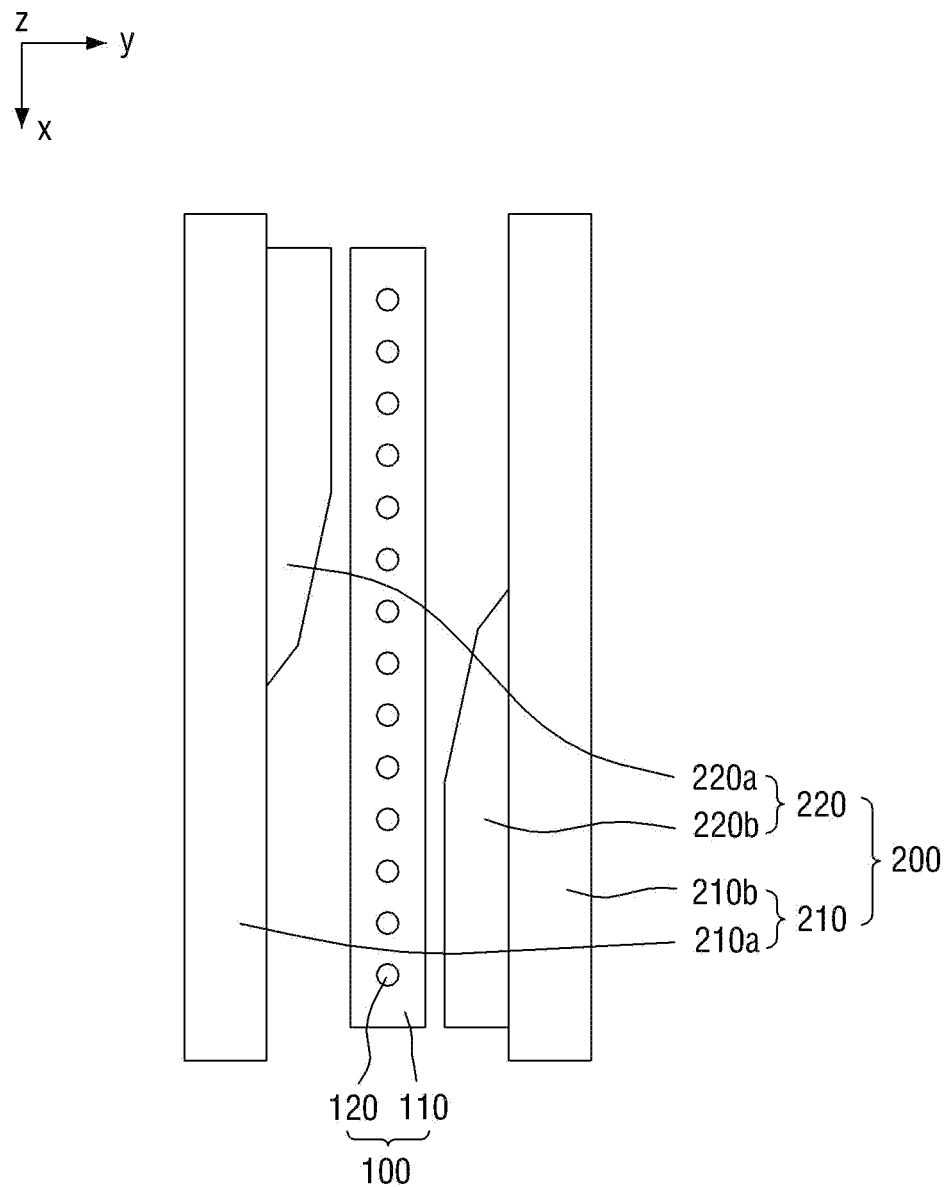
FIG. 5 is a plan view illustrating a first application example of a deposition source and a shutter of the deposition apparatus shown in FIG. 1.
Figure 6:
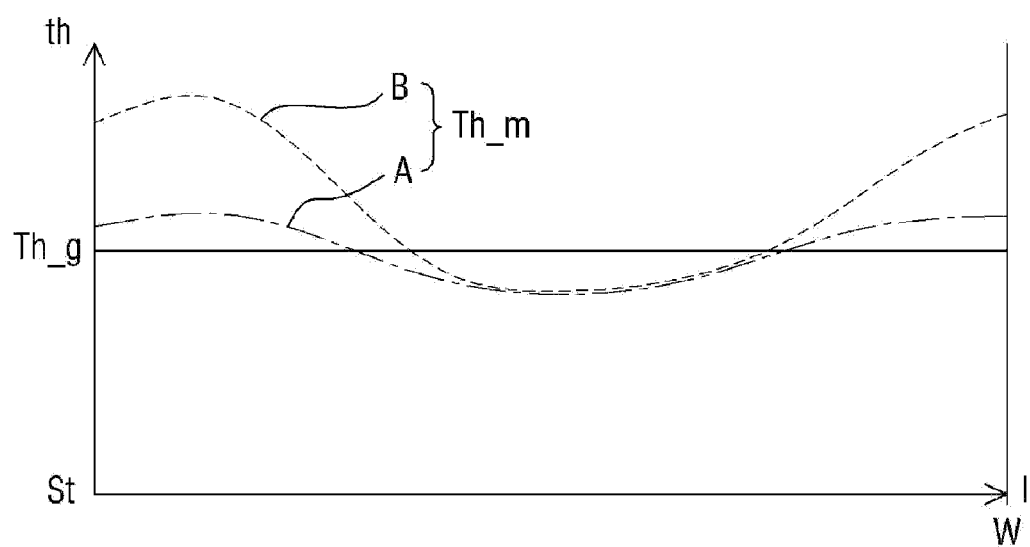
FIG. 6 is a graph illustrating thicknesses of a thin film depending on the length of the thin film before and after the shutter shown in FIG. 5 is employed.

A specific example of the aforementioned embodiment, that is, a first application example, will be described with reference to FIGS. 5 and 6. In the first application, the thin film thickness th is uniformly controlled. FIG. 5 is a plan view illustrating a first application example of a deposition source (100) and a shutter (200) of the deposition apparatus shown in FIG. 1. FIG. 6 is a graph illustrating thicknesses (th) of a thin film depending on the length (l) of the thin film before and after the shutter (200) shown in FIG. 5 is employed.

First, referring to FIG. 6, a measured thin film thickness Th_m in a case where the shutter 200 is not employed, that is, a thin film thickness B measured before correction, may be represented in a waved shape toward a thin film length (l) direction from the standard point St. That is to say, referring to FIG. 3, the thin film thickness B measured at both ends of the substrate 400 before correction may be greater than a goal thin film thickness Th_g, and the thin film thickness B measured at the center of the substrate 400 before correction may be smaller than the goal thin film thickness Th_g.

Here, the thin film thickness th can be corrected by employing the shutter 200 shown in FIG. 5. In detail, a first shutter plate 220a and a second shutter plate 220b shield a jetting passageway jp of the deposition substance, corresponding to both ends of the substrate 400, thereby lowering a thin film formation speed at the both ends of the substrate 400. Therefore, the measured thin film thickness Th_m in an instance where the shutter 200 is employed, that is, the thin film thickness A measured after correction, may be uniformly corrected, compared to the thin film thickness B measured before correction.

Figure 7:
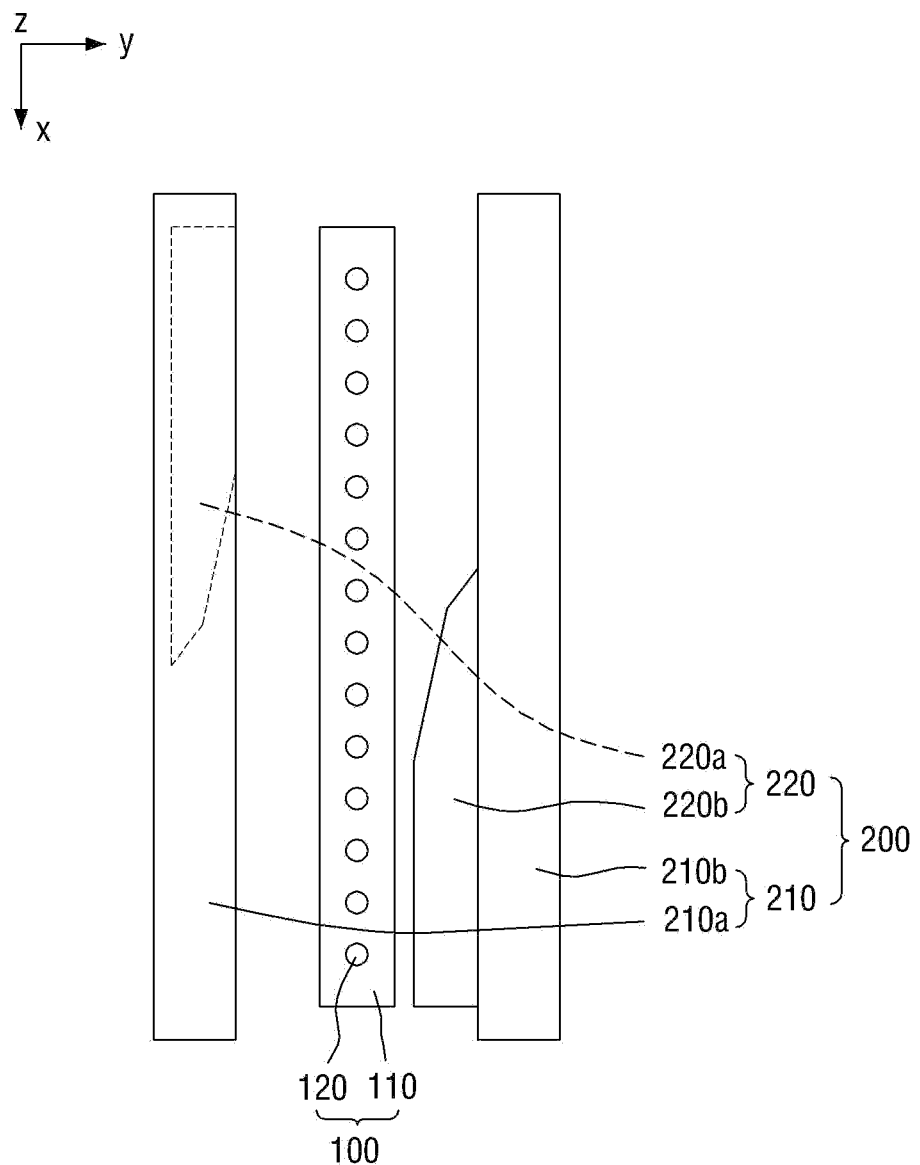
FIG. 7 is a plan view illustrating a first application example of a deposition source and a shutter of the deposition apparatus shown in FIG. 1.
Figure 8:
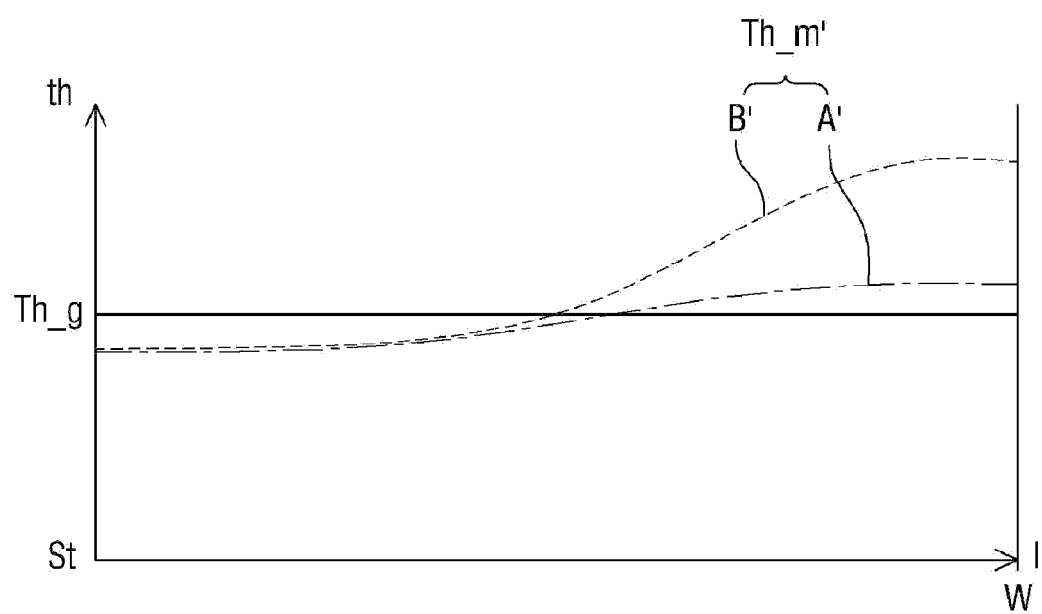
FIG. 8 is a graph illustrating thicknesses of a thin film depending on the length of the thin film before and after the shutter shown in FIG. 7 is employed.

In another specific example of the aforementioned embodiment, that is, a second application, will be described with reference to FIGS. 7 and 8. In the second application, the thin film thickness th is uniformly controlled, like in the first application. FIG. 7 is a plan view illustrating a second application of a deposition source (100) and a shutter (200) of the deposition apparatus shown in FIG. 1. FIG. 8 is a graph illustrating thicknesses (th) of a thin film depending on the length (l) of the thin film before and after the shutter (200) shown in FIG. 7 is employed.

First, referring to FIG. 8, a measured thin film thickness Th_m' in an instance where the shutter 200 is not employed, that is, a thin film thickness B' measured before correction, may increase toward a thin film length (l) direction from the standard point St. That is to say, referring to FIG. 3, the thin film thickness B' measured at both ends of the substrate 400 before correction may be greater than a goal thin film thickness Th_g, and the thin film thickness B' measured at the center of the substrate 400 before correction may be smaller than the goal thin film thickness Th_g.

Here, the thin film thickness th can be corrected by employing the shutter 200 shown in FIG. 7. In greater detail, a first shutter plate 220a is inserted into the shutter plate holder 210 and opens a jetting passageway jp of the deposition substance, corresponding to a portion close to the standard point St, and a second shutter plate 220b shields a jetting passageway jp of the deposition substance, corresponding to a portion far from the standard point St, thereby raising a thin film formation speed at the portion close to the standard point St while lowering the thin film formation speed at the portion far from the standard point St both ends of the substrate 400. Therefore, the measured thin film thickness Th_m' in a case where the shutter 200 shown in FIG. 8 is employed, that is, the thin film thickness A measured after correction, may be uniformly corrected, compared to the thin film thickness B measured before correction.

As described above, in the deposition apparatus according to an embodiment of the disclosed technology, the thickness (th) of the thin film deposited on the one surface of the substrate 400 can be controlled without removing a vacuum during a deposition process.

In addition, a desired thickness of a thin film can be easily obtained by correcting the thickness (th) of the thin film in real time during a deposition process.

FIGS. 9, 10, 12 and 13 are plan views of deposition sources (100, 101) and shutters (201, 202, 203, 204) of deposition apparatuses according to other embodiments of the disclosed technology. FIG. 11 is a side view of a shutter taken along the line XI-XI' of FIG. 10.

FIGS. 9 to 13 illustrate deposition sources (100, 101) and shutters (201, 202, 203, 204) for compensating the thin film thickness (B) measured before correction, as shown in FIG. 6. The thin film thickness (th) measured after correction, as shown in FIG. 6 can be uniformly controlled by employing the deposition sources (100, 101) and the shutters (201, 202, 203, 204). For the sake of convenient explanation, substantially the same elements as those shown in FIGS. 1 to 8 are denoted by the same reference numerals and repeated explanations thereof will be omitted.

First, in the deposition apparatus according to another embodiment of the disclosed technology, the shutter 201 may include a plurality of shutter plates 221 arranged in a first direction. The plurality of shutter plates 221 are independently controlled to open or shield a jetting passageway jp of the deposition substance. In an exemplary embodiment, at least two of the plurality of shutter plates 221 may protrude by different distances to control a jet region jr of the deposition substance. In another exemplary embodiment, a plurality of first shutter plates 221a installed in a first shutter plate holder 210a and a plurality of second shutter plates 221b installed in a second shutter plate holder 210b are symmetrical to each other.

Figure 9:
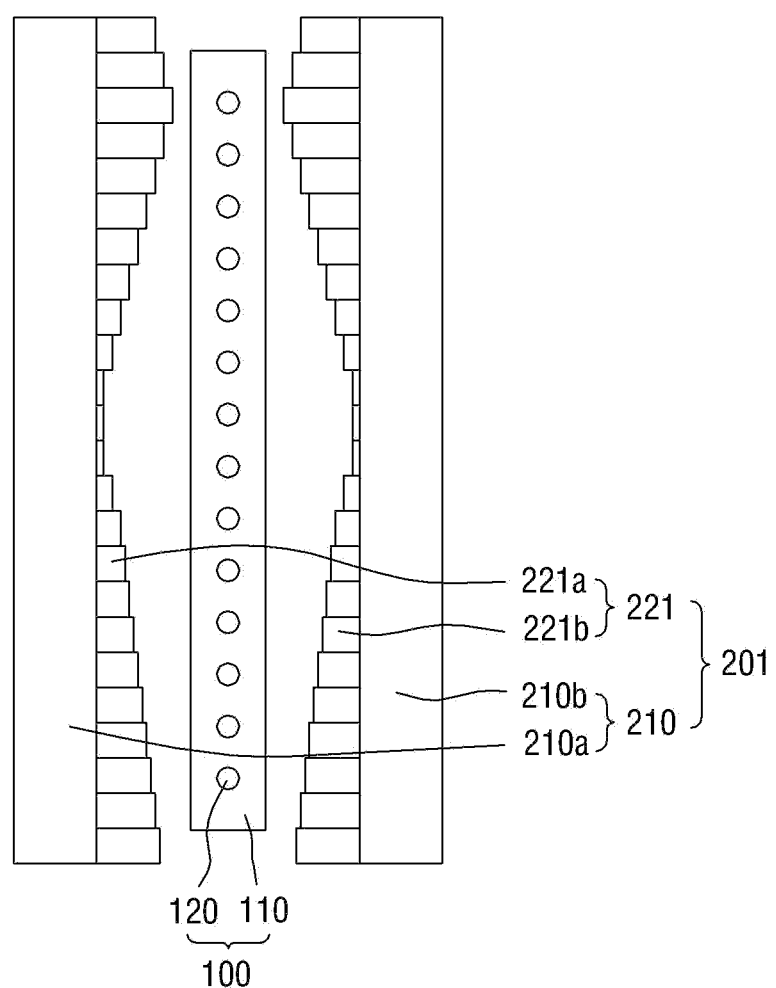
FIGS. 9, 10, 12 and 13 are plan views of deposition sources and shutters of deposition apparatuses according to other embodiments of the technology.
Figure 10:
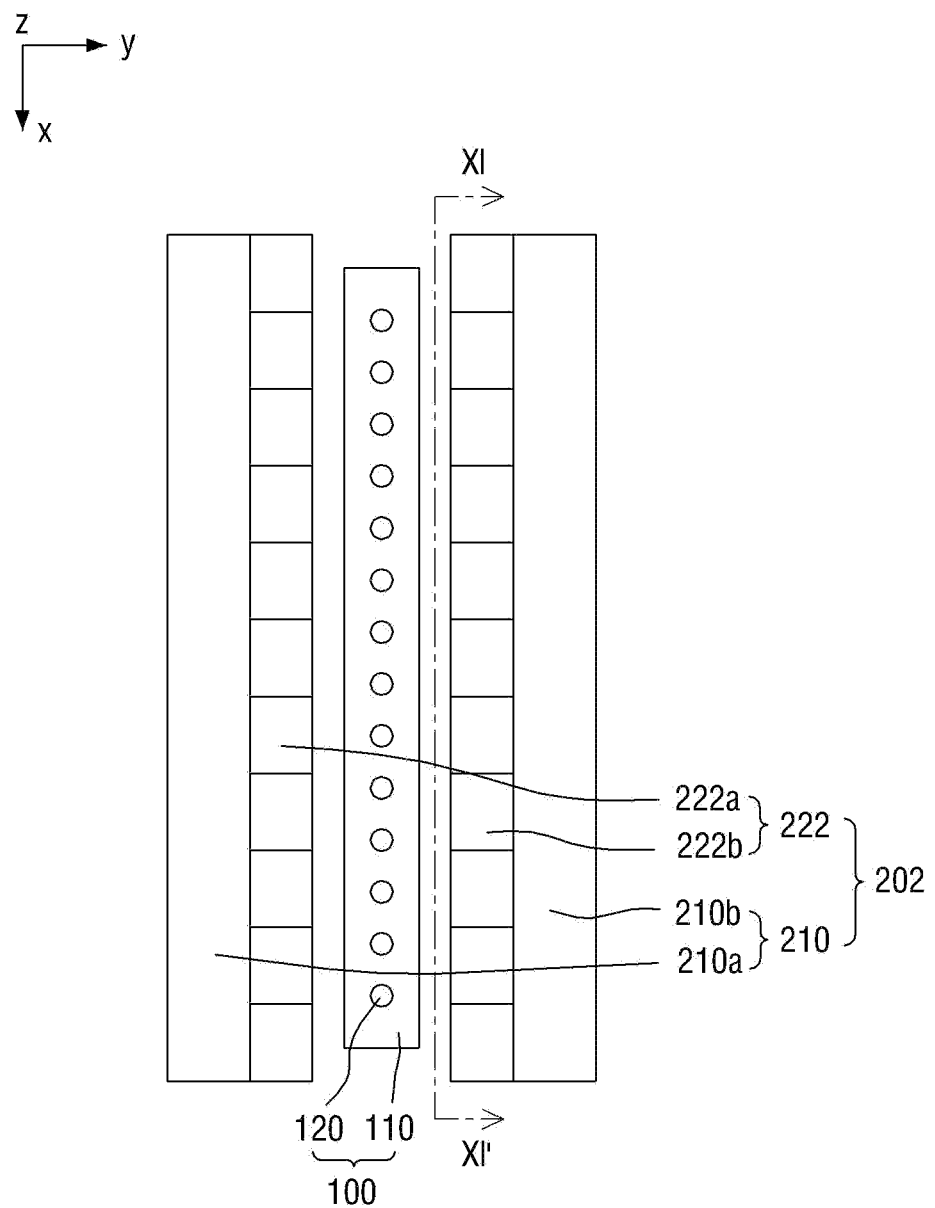
Figure 11:
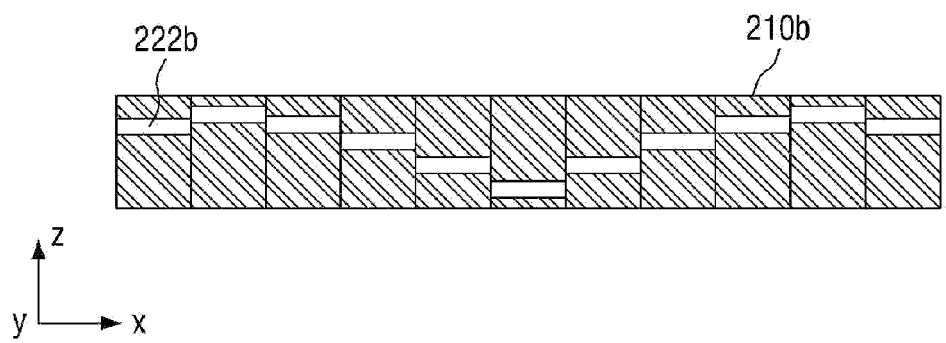
FIG. 11 is a side view of a shutter taken along the line XI-XI' of FIG. 10.
Figure 12:
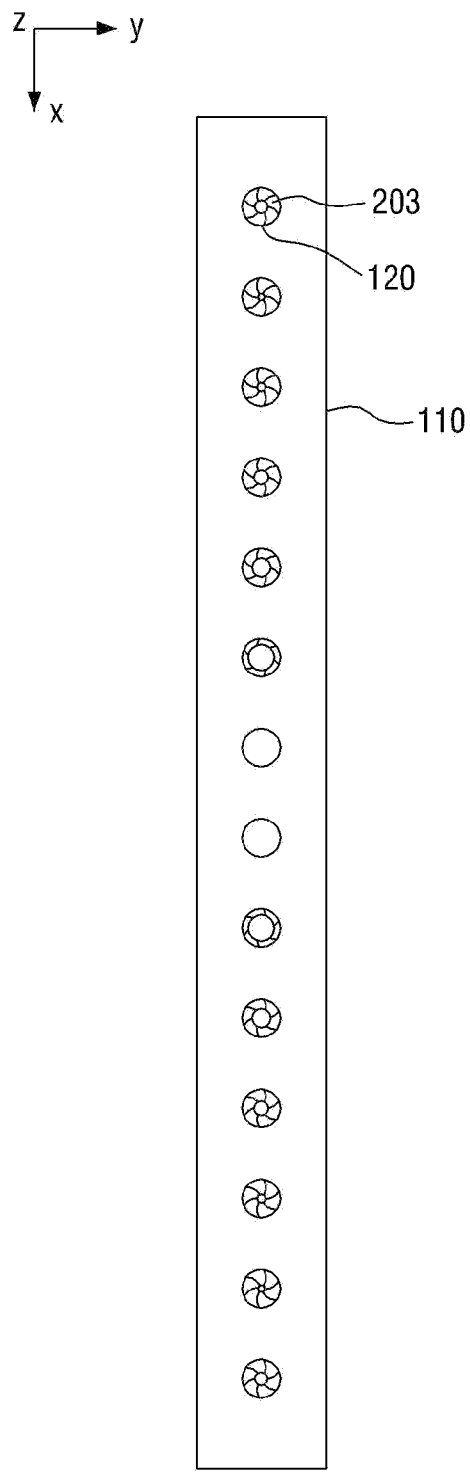

Next, in the deposition apparatus according to still another embodiment of the disclosed technology, as shown in FIG. 10, the shutter 202 may include a plurality of shutter plates 222 arranged in a first direction, like the deposition apparatus shutter 201 shown in FIG. 9. However, the plurality of shutter plates 222 may protrude the same distance from the shutter plate holder 210 toward jet nozzles 120. In an exemplary embodiment, a plurality of first shutter plates 222a installed in a first shutter plate holder 210a and a plurality of second shutter plates 222b installed in a second shutter plate holder 210b may be symmetrical to each other.

However, referring to FIG. 11, at least two of the plurality of shutter plates 222 may have different heights. In FIG. 11, the height may correspond to a distance in the z direction from the bottom surface of the shutter plate holder 210. That is to say, some of the shutter plates 222 have relatively large heights, thereby reducing an ejection angle of the deposition substance. In addition, the others of the shutter plates 222 have relatively small heights, thereby increasing the ejection angle of the deposition substance.

Next, the deposition apparatus according to still another embodiment of the disclosed technology, as shown in FIG. 10, the shutter 203 may be incorporated into each of a plurality of jet nozzles 120. The shutter 203 opens or shields the jet nozzles 120, like a camera shutter, thereby controlling jet amounts of the respective jet nozzles 120 by varying sizes of openings of the jet nozzles 120.

Figure 13:
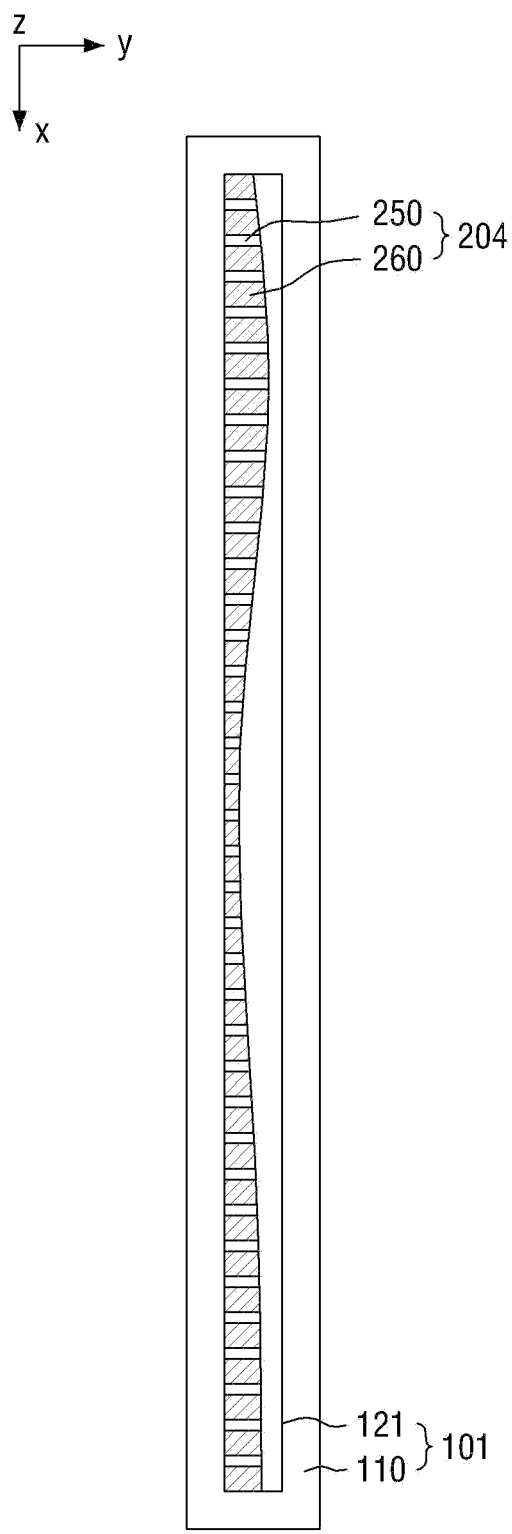

Next, the deposition apparatus according to still another embodiment of the disclosed technology, as shown in FIG. 13, a deposition source 101 may include jet nozzles 121 shaped of slits elongated in a first direction. In an exemplary embodiment, the jet nozzles 121 may be slit nozzles. In addition, the shutter 204 is incorporated into each of the jet nozzles 121 and may control jet amounts of the respective jet nozzles 121, like in the deposition apparatus shown in FIG. 12. In an exemplary embodiment, the shutter 204 may include a plurality of shutter blades 250 protruding from one side of the jet nozzles 121 and a shutter plate 260 connecting the shutter blades 250 and shielding at least some of the jet nozzles 121. Here, the shutter blades 250 may be shaped of thin rods, and the shutter plate 260 may be a flexible film.

Hereinafter, a deposition method according to an embodiment of the disclosed technology will be described with reference to FIGS. 1 to 4.

The deposition method according to an embodiment of the disclosed technology may include forming a thin film 500 on a substrate 400 by jetting a deposition substance from a deposition source 100, measuring a thickness of the thin film 500, that is, a measured thin film thickness (Th_m), and comparing the measured thin film thickness Th_m with a predetermined thickness, that is, a goal thin film thickness (Th_g). In addition, the deposition method according to an embodiment of the disclosed technology may include, when the measured thin film thickness Th_m is greater than the goal thin film thickness Th_g, shielding at least a portion of the jet region jr of the deposition substance facing the thin film 500, and/or when the goal thin film thickness Th_g is greater than the measured thin film thickness Th_m, opening at least a portion of the jet region jr of the deposition substance facing the thin film 500.

Hereinafter, a deposition source 100 according to an embodiment of the disclosed technology will be described with reference to FIGS. 1 to 4.

The deposition source 100 according to an embodiment of the disclosed technology may include the shutter 200, the thickness measurement sensor 300, and the controller 600 in addition to the deposition source holder 110 and the jet nozzles 120. That is to say, the deposition source 100 may be integrally formed with the shutter 200, the thickness measurement sensor 300, and the controller 600.

While the disclosed technology has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A thin film deposition method, comprising:
forming a thin film on a substrate by jetting a deposition substance from a deposition source;
measuring a thickness of the thin film while jetting the deposition substance and comparing the thickness of the thin film with a predetermined thickness; and
after the measuring the thickness of the thin film and comparing the thickness of the thin film with the predetermined thickness, when the thickness of the thin film is greater than the predetermined thickness, further comprising, shielding at least a portion of a jet region of the deposition substance facing the thin film,
wherein the jet region is between the substrate and the deposition source,
after the measuring the thickness of the thin film and comparing the thickness of the thin film with the predetermined thickness, further comprising opening at least a portion of the jet region of the deposition substance facing the thin film when the predetermined thickness is greater than the thickness of the thin film,
wherein the deposition source includes a plurality of jet nozzles that jet the deposition substance and are arranged in a first direction, and wherein the shielding or the opening at least a portion of the jet region is controlled by shielding or opening at least a portion of a jetting passageway of the deposition substance, and
wherein each jet nozzle has a shutter including multiple shutter blades operating to symmetrically and axially lessen or widen an opening for the deposition substance to pass through.

2. A thin film deposition method, comprising:
forming a thin film on a substrate by jetting a deposition substance from a deposition source;
measuring a thickness of the thin film and comparing the thickness of the thin film with a predetermined thickness; and
when the thickness of the thin film is greater than the predetermined thickness, shielding at least a portion of a jet region of the deposition substance facing the thin film,
wherein the jet region is between the substrate and the deposition source, after the measuring the thickness of the thin film and comparing the thickness of the thin film with the predetermined thickness, further comprising opening at least a portion of the jet region of the deposition substance facing the thin film when the predetermined thickness is greater than the thickness of the thin film,
wherein the deposition source includes a plurality of jet nozzles that jet the deposition substance and are arranged in a first direction,
wherein the shielding or the opening at least a portion of the jet region is controlled by shielding or opening at least a portion of a jetting passageway of the deposition substance using at least one shutter,
wherein the shutter comprises:
at least one shutter plate holder formed to extend in the first direction and arranged in parallel with the plurality of jet nozzles; and
at least one shutter plate protruding from the shutter plate holder in a direction toward the jet nozzles,
and wherein a protruded distance of the shutter plate decreases in a direction toward a center of the shutter plate holder.

3. The deposition method of claim 2, wherein a plurality of shutter blades protrude from one side of the jet nozzles, and wherein the shutter plate connects the shutter blades and shields at least some of the jet nozzles.

4. The deposition method of claim 2, wherein the shutter plate includes a plurality of sub shutter plates and are arranged in the first direction, the plurality of sub shutter plates are symmetrical with respect to a center of the deposition source, and at least two of the plurality of sub shutter plates protrude by different distances to control the jet region of the deposition substance.

5. A thin film deposition method, comprising:
forming a thin film on a substrate by jetting a deposition substance from a deposition source;
measuring a thickness of the thin film and comparing the thickness of the thin film with a predetermined thickness; and when the thickness of the thin film is greater than the predetermined thickness, shielding at least a portion of a jet region of the deposition substance facing the thin film, wherein the jet region is between the substrate and the deposition source, after the measuring the thickness of the thin film and comparing the thickness of the thin film with the predetermined thickness, further comprising opening at least a portion of the jet region of the deposition substance facing the thin film when the predetermined thickness is greater than the thickness of the thin film, wherein the deposition source includes a plurality of jet nozzles that jet the deposition substance and are arranged in a first direction, wherein the shielding or the opening at least a portion of the jet region is controlled by shielding or opening at least a portion of a jetting passageway of the deposition substance using at least one shutter, and wherein the shutter is incorporated into each of the jet nozzles and controls jet amounts of the jet nozzles.

6. The deposition method of claim 1, wherein the deposition source moves in a direction perpendicular to the first direction and in parallel with one surface of the substrate.

7. The deposition method of claim 1, wherein the measuring the thickness of the thin film is carried out by a thickness measurement sensor that is formed to extend in the first direction and is arranged in parallel with the plurality of jet nozzles.

8. The deposition method of claim 1, wherein the comparing the thickness of the thin film with the predetermined thickness, the shielding at least a portion of the jet region, and the opening at least a portion of the jet region are carried out by a controller that controls the shutter according to a difference between the thickness of the thin film and the predetermined thickness.

9. The deposition method of claim 8, wherein the controller comprises:
- a thickness calculation part that calculates the thickness of the thin film;
- a thickness storage part that stores the predetermined thickness;
- a thickness comparison part that calculates the difference between the thickness of the thin film and the predetermined thickness; and
- a compensation calculation part that controls the shutter to be opened or shielded according to the difference.

10. The deposition method of claim 9, wherein the compensation calculation part shields the shutter facing the thin film when the thickness of the thin film is greater than the predetermined thickness, and opens the shutter facing the thin film when the predetermined thickness is greater than the thickness of the thin film.

11. The deposition method of claim 1, wherein the measuring the thickness of the thin film is carried out by a thickness measurement sensor, and wherein the thickness measurement sensor moves in the same direction as the direction in which the deposition source moves.

12. The deposition method of claim 11, wherein the thickness measurement sensor is integrally formed with the deposition source.

* * * * *